(12) United States Patent
Xu

(10) Patent No.: US 11,404,546 B2
(45) Date of Patent: Aug. 2, 2022

(54) LDMOSFET DEVICE AND METHOD FOR MAKING THE SAME

(71) Applicant: SHANGHAI HUAHONG GRACE SEMICONDUCTOR MANUFACTURING CORPORATION, Shanghai (CN)

(72) Inventor: Zhaozhao Xu, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 16/913,156

(22) Filed: Jun. 26, 2020

(65) Prior Publication Data

US 2021/0036112 A1 Feb. 4, 2021

(30) Foreign Application Priority Data

Jul. 29, 2019 (CN) .......................... 201910686718.3

(51) Int. Cl.
*H01L 29/40* (2006.01)
*H01L 29/66* (2006.01)
*H01L 29/78* (2006.01)

(52) U.S. Cl.
CPC .......... *H01L 29/404* (2013.01); *H01L 29/401* (2013.01); *H01L 29/66681* (2013.01); *H01L 29/7816* (2013.01)

(58) Field of Classification Search
CPC ................. H01L 29/404; H01L 29/401; H01L 29/42368; H01L 29/0653; H01L 29/1045; H01L 29/66659; H01L 29/7835; H01L 29/66681–66704; H01L 29/7816–7826; H01L 29/402–407; H01L 29/665–66507
See application file for complete search history.

(56) References Cited

U.S. PATENT DOCUMENTS

| | | | | |
|---|---|---|---|---|
| 7,262,476 | B2* | 8/2007 | Bude | H01L 29/1083 257/341 |
| 7,589,378 | B2* | 9/2009 | Kocon | H01L 29/0878 257/343 |
| 10,998,416 | B2* | 5/2021 | You | H01L 29/66674 |
| 2008/0023785 | A1* | 1/2008 | Hebert | H01L 29/66659 257/492 |
| 2016/0005640 | A1* | 1/2016 | Shinohara | H01L 21/76205 438/425 |
| 2018/0219093 | A1* | 8/2018 | Chou | H01L 29/66681 |
| 2021/0036112 | A1* | 2/2021 | Xu | H01L 29/42368 |

FOREIGN PATENT DOCUMENTS

CN 109980011 A * 7/2019 ....... H01L 29/66659

* cited by examiner

*Primary Examiner* — Shahed Ahmed
(74) *Attorney, Agent, or Firm* — MKG, LLC

(57) ABSTRACT

The disclosure discloses an LDMOSFET device. The second side of a polysilicon gate is extended to the surface of a drift region field oxide and forms a first field plate. A second field plate dielectric layer and a second field plate are formed between the second side of the polysilicon gate and the second side of the drift region field oxide. The second field plate is formed by a metal silicide formed on the surface of the self-aligned block dielectric layer. The first field plate and the second field plate are connected together through a metal layer and are connected to a gate formed by the metal layer. The disclosure further discloses a method for making the LDMOSFET device. The disclosure can optimize the relationship between BV and Rsp of the device.

10 Claims, 5 Drawing Sheets

LDMOSFET DEVICE AND METHOD FOR MAKING THE SAME

CROSS-REFERENCES TO RELATED APPLICATIONS

This application claims priority to Chinese patent application No. CN201910686718.3 filed on Jul. 29, 2019, and entitled "LDMOSFET DEVICE AND METHOD FOR MAKING THE SAME", the disclosure of which is incorporated herein by reference in entirety.

TECHNICAL FIELD

The disclosure relates to the field of semiconductor integrated circuit manufacture, in particular to an LDMOSFET device. The disclosure further relates to a method for making the LDMOSFET device.

BACKGROUND

Double-diffused MOS (DMOS) has been widely used in power management circuits because of its features such as high breakdown voltage, high current driving capability and low power consumption. In a Lateral Double-diffused MOSFET (LDMOSFET) device, Specific on-Resistance (Rsp) and Breakdown Voltage (BV) are two important parameters. In a Bipolar-CMOS-DMOS (BCD) process, due to the contradiction between high breakdown voltage and low specific on-resistance, it is often unable to meet the requirements of LD-MOSFET switch mode application, so how to optimize the relationship between BV and Rsp of LDMOSFET devices and simplify its manufacturing process is very important to improve product competitiveness.

Referring to FIG. 1, it is a structural schematic diagram of an existing first-type LDMOSFET device. The existing first-type LDMOSFET device includes:

A semiconductor substrate 1. A first-conductive-type drift region 3 and a second-conductive-type body region 4 are formed in a selected region of the semiconductor substrate 1. The drift region 3 and the body region 4 are in lateral contact or are spaced apart. Generally, the semiconductor substrate 1 is a silicon substrate. A silicon epitaxial layer is formed on the surface of the semiconductor substrate 1. The drift region 3 and the body region 4 are formed in the silicon epitaxial layer.

A drift region field oxide 2a is formed in a selected region of the drift region 3. In FIG. 1, the drift region field oxide 2a is formed by a shallow trench isolation oxide layer. Referring to FIG. 1, it can be seen that the top surface of the drift region field oxide 2a is in flush with the surface of the semiconductor substrate 1, and the drift region field oxide 2a is filled in a shallow trench formed in the semiconductor substrate 1.

A gate structure formed by superposing a gate dielectric layer 5 and a polysilicon gate 6 is formed on the surface of the body region 4. The surface of the body region 4 covered by the polysilicon gate 6 is used for forming a channel.

The second side of the polysilicon gate 6 is extended to the surface of the drift region field oxide 2a. The polysilicon gate 6 extended to the drift region field oxide 2a forms a field plate. The drift region field oxide 2a at the bottom of the field plate forms a field plate dielectric layer.

Sidewalls 9 are formed on the side surfaces of the polysilicon gate 6.

A source region 7a formed by a first-conductive-type heavily doped region is formed on the surface of the body region 4, and the second side of the source region 7a is self-aligned with the first side of the polysilicon gate 6. The source region 7a is connected to a source formed a front metal layer. A leading-out region 8 of body region formed by a second-conductive-type heavily doped region is also formed on the surface of the body region 4. The region 8 and the source region 7a are connected to a first metal layer 113 through the same contact holes 112 in the top.

A drain region 7b formed by a first-conductive-type heavily doped region is formed in the drift region 3 outside the second side of the drift region field oxide 2a. The drain region 7b is connected to a drain formed by a metal layer.

Referring to FIG. 2, it is a structural schematic diagram of an existing second-type LDMOSFET device. The difference of the existing second-type LDMOSFET device from the existing first-type LDMOSFET device lies in the following:

In the existing second-type LDMOSFET device, the drift region field oxide 2b is formed by an oxide layer which is formed by selectively etching an oxide layer deposited on the surface of the semiconductor substrate 1. Therefore, the drift region field oxide 2b in the device is located on the surface of the semiconductor substrate 1.

BRIEF SUMMARY OF THE INVENTION

The technical problem to be solved by the disclosure is to provide an LDMOSFET device, which can increase the breakdown voltage of the device, reduce the specific on-resistance of the device and optimize the relationship between the breakdown voltage and the specific on-resistance of the device. For this reason, the disclosure further provides a method for making the LDMOSFET device.

In order to solve the above technical problem, the LDMOSFET provided by the disclosure includes:

A semiconductor substrate. A first-conductive-type drift region and a second-conductive-type body region are formed in a selected region of the semiconductor substrate. The drift region and the body region are in lateral contact or are spaced apart.

A drift region field oxide is formed in a selected region of the drift region.

A gate structure formed by superposing a gate dielectric layer and a polysilicon gate is formed on the surface of the body region. The surface of the body region covered by the polysilicon gate is used for forming a channel.

The second side of the polysilicon gate is extended to the surface of the drift region field oxide. The polysilicon gate extended to the drift region field oxide forms a first field plate. The drift region field oxide at the bottom of the first field plate forms a first field plate dielectric layer.

A second field plate dielectric layer and a second field plate are formed between the second side of the polysilicon gate and the second side of the drift region field oxide. The second field plate dielectric layer is formed by superposing the drift region field oxide and a self-aligned block (SAB) dielectric layer formed on the surface of the drift region field oxide. The second field plate is formed by the metal silicide formed on the surface of the SAB dielectric layer. The metal silicide of the second field plate is formed by a first polysilicon layer formed on the surface of the SAB dielectric layer through metal silicification.

The first field plate and the second field plate are connected together through a metal layer.

As a further improvement, the number of the front metal layer is more than one, the first field plate and the second field plate are connected to a first metal layer through contact holes, the first field plate and the second field plate are connected together through the first metal layer, and the contact holes pass through a first interlayer dielectric film.

As a further improvement, a third field plate dielectric layer and a third field plate are formed between the second side of the second field plate dielectric layer and the second side of the drift region field oxide, the third field plate dielectric layer includes a superposition structure of the drift region field oxide and the first interlayer dielectric film, and the third field plate is formed by the first metal layer which covers a position above the third field plate dielectric layer and is connected to the first field plate.

As a further improvement, the drift region field oxide is formed by a shallow trench isolation oxide layer;

or the drift region field oxide is formed by an oxide layer which is formed by selectively etching an oxide layer deposited on the surface of the semiconductor substrate.

As a further improvement, the first polysilicon layer corresponding to the metal silicide of the second field plate retains a part of thickness; or, the first polysilicon layer corresponding to the metal silicide of the second field plate is completely converted into the metal silicide.

The width of the first polysilicon layer corresponding to the metal silicide of the second field plate dielectric layer and the second field plate is the same, aligned and defined by the SAB mask.

As a further improvement, sidewalls are formed on the side surfaces of the polysilicon gate.

A source region formed by a first-conductive-type heavily doped region is formed on the surface of the body region, the second side of the source region is self-aligned with the first side of the polysilicon gate, and the source region is connected to a source formed by the metal layer.

A drain region formed by a first-conductive-type heavily doped region is formed in the drift region outside the second side of the drift region field oxide, and the drain region is connected to a drain formed by the metal layer.

The metal silicide is also formed on the surfaces of the polysilicon gate, the source region and the drain region.

As a further improvement, a first insulating dielectric layer is formed on the surface of the semiconductor substrate and covers the metal silicide on the surface of the source region, the sidewalls of the polysilicon gate, the metal silicide on the surface of the polysilicon gate, the second field plate and the surface of the drift region field oxide outside the second side of the second field plate; the first interlayer dielectric film is formed on the surface of the first insulating dielectric layer.

As a further improvement, the first insulating dielectric layer further covers the surface of the drift region field oxide, the first interlayer dielectric film is formed on the surface of the first insulating dielectric layer, and the third field plate dielectric layer is formed by superposing the drift region field oxide, the first insulating dielectric layer and the first interlayer dielectric film.

In order to solve the above technical problem, the method for making the LDMOSFET device provided by the disclosure includes the following steps:

step 1: providing a semiconductor substrate, and forming a drift region field oxide in a selected region of the semiconductor substrate;

step 2: forming a drift region in the selected region of the semiconductor substrate by adopting a first-conductive-type ion implantation process, the drift region field oxide being located in a partial region of the drift region;

step 3: forming a body region in the selected region of the semiconductor substrate by adopting a second-conductive-type ion implantation process, the drift region and the body region being in lateral contact or being spaced apart;

step 4: sequentially forming a gate dielectric layer and a polysilicon gate, defining a forming region of a gate structure by adopting a photolithography process, and etching the polysilicon gate and the gate dielectric layer to form the gate structure formed by superposing the etched gate dielectric layer and the polysilicon gate on the surface of the body region, the surface of the body region covered by the polysilicon gate being used for forming a channel;

the second side of the polysilicon gate of the gate structure being extended to the surface of the drift region field oxide, the polysilicon gate extended to the drift region field oxide forming a first field plate, and the drift region field oxide at the bottom of the first field plate forming a first field plate dielectric layer;

step 5: forming a SAB dielectric layer and a first polysilicon layer, and patterning the first polysilicon layer and the SAB dielectric layer by adopting a photolithography process, the patterned SAB dielectric layer and the first polysilicon layer being located between the second side of the polysilicon gate and the second side of the drift region field oxide;

step 6: performing metal silicification to form a metal silicide, the metal silicide including metal silicide formed by performing metal silicification to the first polysilicon layer, the second field plate dielectric layer being formed by superposing the drift region field oxide and the SAB dielectric layer formed on the surface of the drift region field oxide, and the second field plate being formed by the metal silicide formed on the surface of the SAB dielectric layer;

step 7: performing a metal interconnection process, the first field plate and the second field plate being connected together through a metal layer formed in the metal interconnection process.

As a further improvement, in step 7, the number of the metal layer is more than one, the first field plate and the second field plate are connected to a first metal layer through contact holes, the first field plate and the second field plate are connected together through the first metal layer, and the contact holes pass through a first interlayer dielectric film.

As a further improvement, a third field plate dielectric layer and a third field plate are formed between the second side of the second field plate dielectric layer and the second side of the drift region field oxide, the third field plate dielectric layer includes a superposition structure of the drift region field oxide and the first interlayer dielectric film, and the third field plate is formed by the first metal layer which covers a position above the third field plate dielectric layer and is connected to the first field plate.

As a further improvement, in step 1, the drift region field oxide is formed by a shallow trench isolation oxide layer formed by adopting a shallow trench isolation process;

or the forming process of the drift region field oxide includes: firstly depositing an oxide layer on the surface of the semiconductor substrate, and then selectively etching the deposited oxide layer to form the drift region field oxide.

As a further improvement, in step 6, after the metal silicification is completed, the first polysilicon layer corresponding to the metal silicide of the second field plate retains a part of thickness; or, the first polysilicon layer corresponding to the metal silicide of the second field plate is completely converted into the metal silicide.

The width of the first polysilicon layer corresponding to the metal silicide of the second field plate dielectric layer and the second field plate is the same, aligned and defined by adopting the same mask.

As a further improvement, after the gate structure is formed in step 4, the method further includes a step of forming sidewalls on the side surfaces of the polysilicon gate;

a step of performing first-conductive-type heavily doped source and drain implantation to form a source region and a drain region. The source region are formed on the surface of the body region, the second side of the source region are self-aligned with the first side of the polysilicon gate, and the drain region are formed in the drift region outside the second side of the drift region field oxide.

In step 6, the metal silicide is also formed on the surfaces of the polysilicon gate, the source region and the drain region.

After step 7 is completed, the source region is connected to a source formed by the metal layer; the drain region is connected to a drain formed by the metal layer.

As a further improvement, the method in step 7, before the first interlayer dielectric film is formed, further includes a step of forming a first insulating dielectric layer. The first insulating dielectric layer is formed on the surface of the semiconductor substrate and covers the metal silicide on the surface of the source region, the sidewalls of the polysilicon gate, the metal silicide on the surface of the polysilicon gate, the second field plate and the surface of the drift region field oxide outside the second side of the second field plate. The first interlayer dielectric film is formed on the surface of the first insulating dielectric layer.

In the disclosure, the field plate structure at the top of the drift region of the LDMOSFET device is specially arranged and at least includes the first field plate formed by the polysilicon gate extended to the drift region field oxide and the second field plate formed between the second side of the polysilicon gate and the second side of the drift region field oxide; the drift region field oxide at the bottom of the first field plate forms the first field plate dielectric layer; the second field plate dielectric layer is formed by superposing the drift region field oxide and the SAB dielectric layer formed on the surface of the drift region field oxide; the second field plate is formed by the metal silicide formed on the surface of the SAB dielectric layer. Since the second field plate dielectric layer is formed by superposing the drift region field oxide and the SAB dielectric layer, the thickness is greater than that of the first field plate dielectric layer formed by the drift region field oxide, so it can optimize the electric field distribution of the drift region and optimize the relationship between the breakdown voltage and the specific on-resistance of the device, can reduce the specific on-resistance of the device while improving or keeping the breakdown voltage of the device unchanged, and thus can optimize the performance of the device.

In the disclosure, the second field plate is formed by the metal silicide formed on the surface of the SAB dielectric layer. The metal silicide is formed by performing metal silicification to the first polysilicon layer formed on the surface of the SAB dielectric layer. The first polysilicon layer can share the same mask with the SAB dielectric layer, so the number of the mask is not increased and the cost is low.

In the disclosure, the third field plate may also be provided. The third field plate is formed by the first metal layer which is located between the second side of the second field plate dielectric layer and the second side of the drift region field oxide and is connected with the first field plate. The third field plate dielectric layer includes the superposition structure of the drift region field oxide and the first interlayer dielectric film. Compared with the second field plate dielectric layer and the first field plate dielectric layer, the thickness of the third field plate dielectric layer is greater, so the relationship between the breakdown voltage and the specific on-resistance of the device can be further optimized.

BRIEF DESCRIPTION OF THE DRAWINGS

The disclosure will be further described below in detail in combination with the embodiments with reference to the drawings.

DETAILED DESCRIPTION OF PREFERRED EMBODIMENTS OF THE INVENTION

Embodiment 1 of the disclosure provides an LDMOSFET device.

Figure 1:
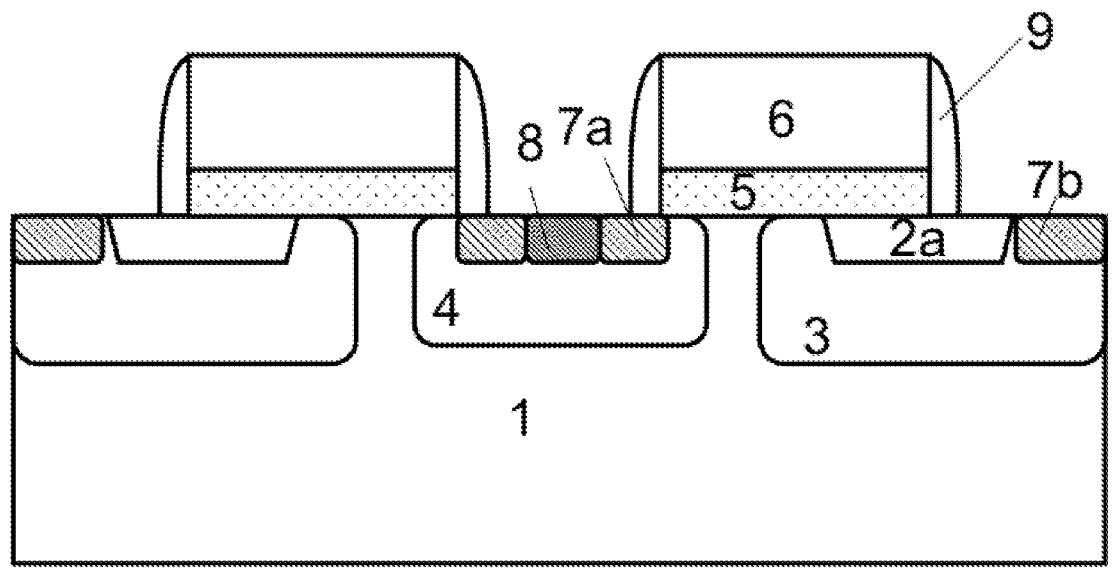
FIG. 1 is a structural schematic view of a first-type LDMOSFET device.
Figure 2:
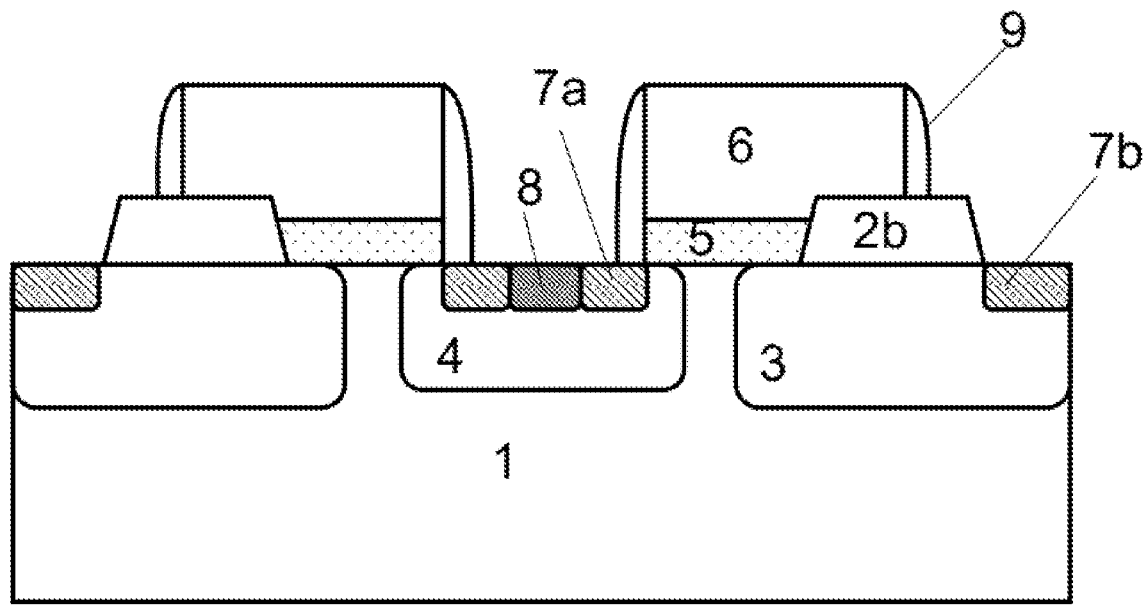
FIG. 2 is a structural schematic view of a second-type LDMOSFET device.
Figure 3:
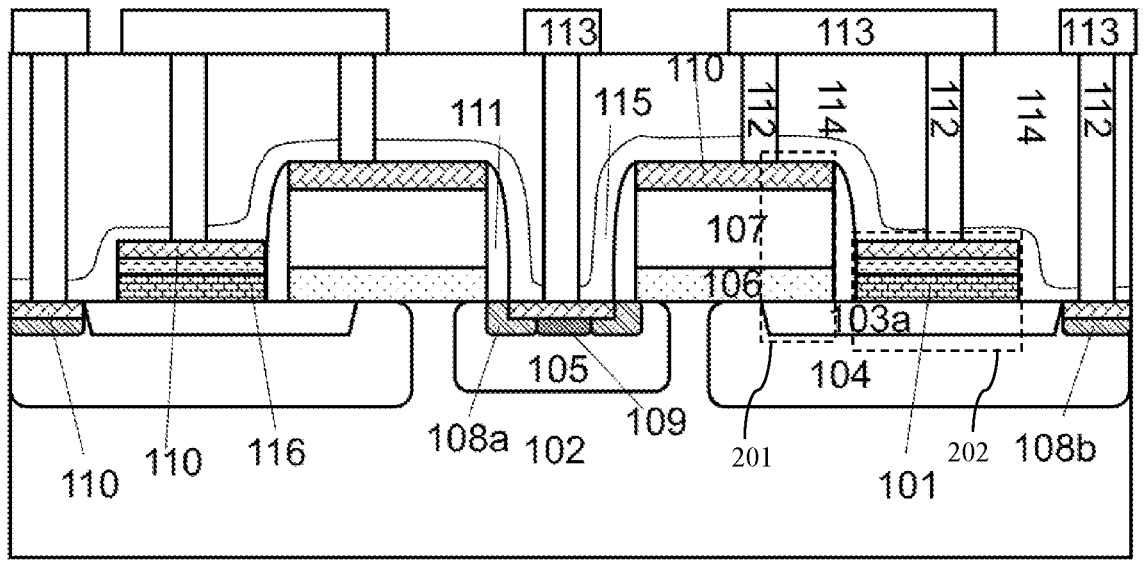
FIG. 3 is a structural schematic view of an LDMOSFET device according to embodiment 1 of the disclosure.

Referring to FIG. 3, it is a structural schematic view of the LDMOSFET device according to embodiment 1 of the disclosure. The LDMOSFET device according to embodiment 1 of the disclosure includes:

A semiconductor substrate 102. A first-conductive-type drift region 104 and a second-conductive-type body region 105 are formed in a selected region of the semiconductor substrate 102. The drift region 104 and the body region 105 are in lateral contact or are spaced apart. Generally, the semiconductor substrate 102 is a silicon substrate. A silicon epitaxial layer is formed on the surface of the semiconductor substrate 102. The drift region 104 and the body region 105 are formed in the silicon epitaxial layer.

A drift region field oxide 103a is formed in a selected region of the drift region 104. In embodiment 1 of the disclosure, the drift region field oxide 103a is formed by a shallow trench isolation oxide layer. Referring to FIG. 3, it can be seen that the top surface of the drift region field oxide 103a is in flush with the surface of the semiconductor substrate 102, and the drift region field oxide 103a is filled in a shallow trench formed in the semiconductor substrate 102.

A gate structure formed by superposing a gate dielectric layer 106 and a polysilicon gate 107 is formed on the surface of the body region 105. The surface of the body region 105 covered by the polysilicon gate 107 is used for forming a channel. The material of the gate dielectric layer 106 is silicon oxide. In other embodiments, the material of the gate dielectric layer 106 may be silicon oxynitride or a high-dielectric-constant material.

The second side of the polysilicon gate 107 is extended to the surface of the drift region field oxide 103a. The polysilicon gate 107 extended to the drift region field oxide 103a forms a first field plate. The drift region field oxide 103a at the bottom of the first field plate forms a first field plate dielectric layer. The forming regions of the first field plate and the first field plate dielectric layer are as illustrated in a dashed line frame 201.

Sidewalls 111 are formed on the side surfaces of the polysilicon gate 107.

A second field plate dielectric layer and a second field plate are formed between the second side of the polysilicon gate 107 and the second side of the drift region field oxide 103a. The second field plate dielectric layer is formed by superposing the drift region field oxide 103a and a SAB dielectric layer 101 formed on the surface of the drift region field oxide 103a. The second field plate is formed by the metal silicide 110 formed on the surface of the SAB dielectric layer 101. The metal silicide 110 of the second field plate is formed by a first polysilicon layer 116 formed on the surface of the SAB dielectric layer 101 through metal silicification. The forming regions of the second field plate and the second field plate dielectric layer are as illustrated in a dashed line frame 202.

In embodiment 1 of the disclosure, the first polysilicon layer 116 corresponding to the metal silicide 110 of the second field plate retains a part of thickness. The width of the first polysilicon layer 116 corresponding to the metal silicide 110 of the second field plate dielectric layer and the second field plate is the same, aligned and defined by adopting the same mask. In FIG. 3, the sidewalls are isolated among the polysilicon gate 107, the first polysilicon layer 106 and the metal silicide 110 on the surface of the first polysilicon layer 106.

The first field plate and the second field plate are connected together through a metal layer and are connected to a gate formed by the metal layer. Generally, the number of the metal layer is more than one, the first field plate and the second field plate are connected to a first metal layer 113 through contact holes 112, the first field plate and the second field plate are connected together through the first metal layer 113, and the contact holes 112 pass through a first interlayer dielectric film 114. FIG. 3 illustrates only one metal layer, i.e., the first metal layer 113, and one interlayer dielectric film, i.e., the first interlayer dielectric film 114. More metal layers and corresponding interlayer dielectric films may be arranged according to the needs, and the metal layers are connected through vias.

A source region 108a formed by a first-conductive-type heavily doped region is formed on the surface of the body region 105, and the second side of the source region 108a is self-aligned with the first side of the polysilicon gate 107. The source region 108a is connected to a source formed by the metal layer. In embodiment 1 of the disclosure, a leading-out region 109 of body region 102 formed by a second-conductive-type heavily doped region is also formed on the surface of the body region 105. The leading-out region 109 and the source region 108a are connected to the first metal layer 113 through the same contact holes 112 in the top, which means the body region and source region is butted together.

A drain region 108b formed by a first-conductive-type heavily doped region is formed in the drift region 104 outside the second side of the drift region field oxide 103a. The drain region 108b is connected to a drain formed by a metal layer.

The metal silicide 110 is also formed on the surfaces of the polysilicon gate 107, the source region 108a and the drain region 108b.

A first insulating dielectric layer 115 is formed on the surface of the semiconductor substrate 102 and covers the metal silicide 110 on the surface of the source region 108a, the sidewalls 111 of the polysilicon gate 107, the metal silicide 110 on the surface of the polysilicon gate 107, the second field plate and the surface of the drift region field oxide 103a outside the second side of the second field plate. The first interlayer dielectric film 114 is formed on the surface of the first insulating dielectric layer 115. Generally, the material of the first interlayer dielectric film 114 is an oxide layer, the material of the first insulating dielectric layer 115 includes an oxide and a nitride layer, and the nitride layer is used as a Contact Etch Stop Layer (CESL).

In embodiment 1 of the disclosure, the LDMOSFET device is an N-type device, the first conductive type is N-type, the second conductive type is P-type, and the semiconductor substrate is P-type doped. In other embodiments, the LDMOSFET device may be a P-type device, the first conductive type may be P-type, and the second conductive type may be N-type.

In embodiment 1 of the disclosure, the field plate structure at the top of the drift region 104 of the LDMOSFET device is specially arranged and at least includes the first field plate formed by the polysilicon gate 107 extended to the drift region field oxide 103a and the second field plate formed between the second side of the polysilicon gate 107 and the second side of the drift region field oxide 103a; the drift region field oxide 103a at the bottom of the first field plate forms the first field plate dielectric layer; the second field plate dielectric layer is formed by superposing the drift region field oxide 103a and the SAB dielectric layer 101 formed on the surface of the drift region field oxide 103a; the second field plate is formed by the metal silicide 110 formed on the surface of the SAB dielectric layer 101. Since the second field plate dielectric layer is formed by superposing the drift region field oxide 103a and the SAB dielectric layer 101, the thickness is greater than that of the first field plate dielectric layer formed by the drift region field oxide 103a, so it can optimize the electric field distribution of the drift region 104 and optimize the relationship between the breakdown voltage and the specific on-resistance of the device, can reduce the specific on-resistance of the device while improving or keeping the breakdown voltage of the device unchanged, and thus can optimize the performance of the device. As shown by simulation experiments, compared with the existing devices, the device in embodiment 1 of the disclosure can effectively reduce Rsp by 17% while keeping BV basically unchanged.

In embodiment 1 of the disclosure, the second field plate is formed by the metal silicide 110 formed on the surface of the SAB dielectric layer 101. The metal silicide 110 is formed by performing metal silicification to the first polysilicon layer 116 formed on the surface of the SAB dielectric layer 101. The first polysilicon layer 116 can share the same mask with the SAB dielectric layer 101, so the number of the mask is not increased and the cost is low.

Embodiment 2 of the disclosure provides an LDMOSFET device.

Figure 4:
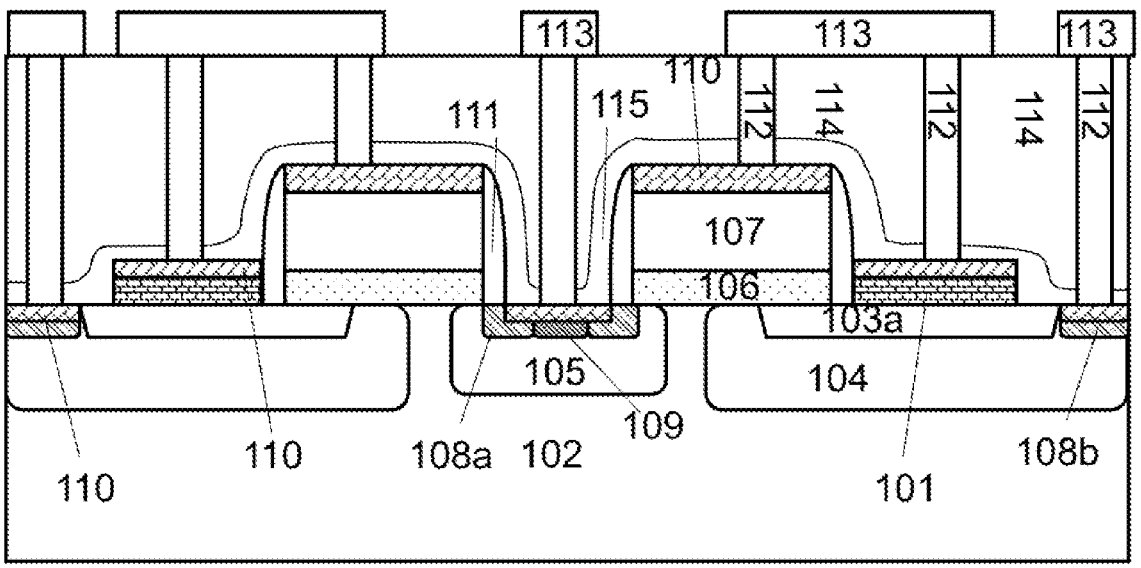
FIG. 4 is a structural schematic view of an LDMOSFET device according to embodiment 2 of the disclosure.

Referring to FIG. 4, it is a structural schematic view of the LDMOSFET device according to embodiment 2 of the disclosure. The difference of the LDMOSFET device according to embodiment 2 of the disclosure from the LDMOSFET device according to embodiment 1 of the disclosure lies in the following:

In the LDMOSFET device according to embodiment 2 of the disclosure, the first polysilicon layer 116 corresponding to the metal silicide 110 of the second field plate is completely converted into the metal silicide 110. From FIG. 4, it can be seen that the first polysilicon layer 116 is not illustrated any longer in FIG. 4.

Embodiment 3 of the disclosure provides an LDMOSFET device.

Figure 5:
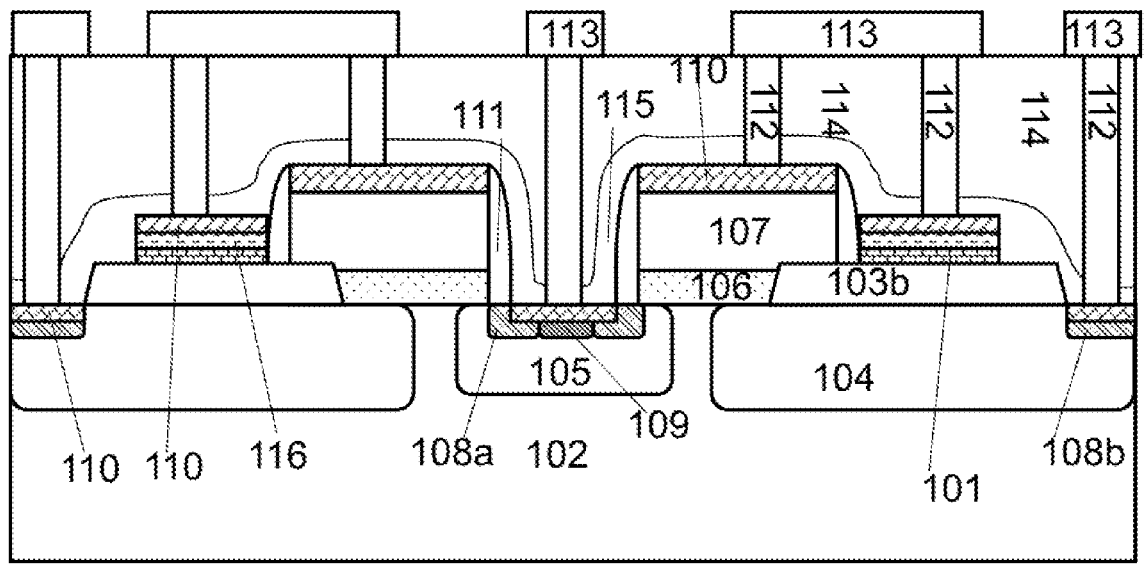
FIG. 5 is a structural schematic view of an LDMOSFET device according to embodiment 3 of the disclosure.

Referring to FIG. 5, it is a structural schematic view of the LDMOSFET device according to embodiment 3 of the disclosure. The difference of the LDMOSFET device according to embodiment 3 of the disclosure from the LDMOSFET device according to embodiment 1 of the disclosure lies in the following:

In the LDMOSFET device according to embodiment 3 of the disclosure, the drift region field oxide 103*b* is formed by an oxide layer which is formed by selectively etching an oxide layer deposited on the surface of the semiconductor substrate 102. Therefore, the drift region field oxide 103*b* in the device according to embodiment 3 of the disclosure is located on the surface of the semiconductor substrate 102.

Embodiment 4 of the disclosure provides an LDMOSFET device.

The difference of the LDMOSFET device according to embodiment 4 of the disclosure from the LDMOSFET device according to embodiment 3 of the disclosure lies in the following:

In the LDMOSFET device according to embodiment 4 of the disclosure, the first polysilicon layer 116 corresponding to the metal silicide 110 of the second field plate is completely converted into the metal silicide 110.

Embodiment 5 of the disclosure provides an LDMOSFET device.

Figure 6:
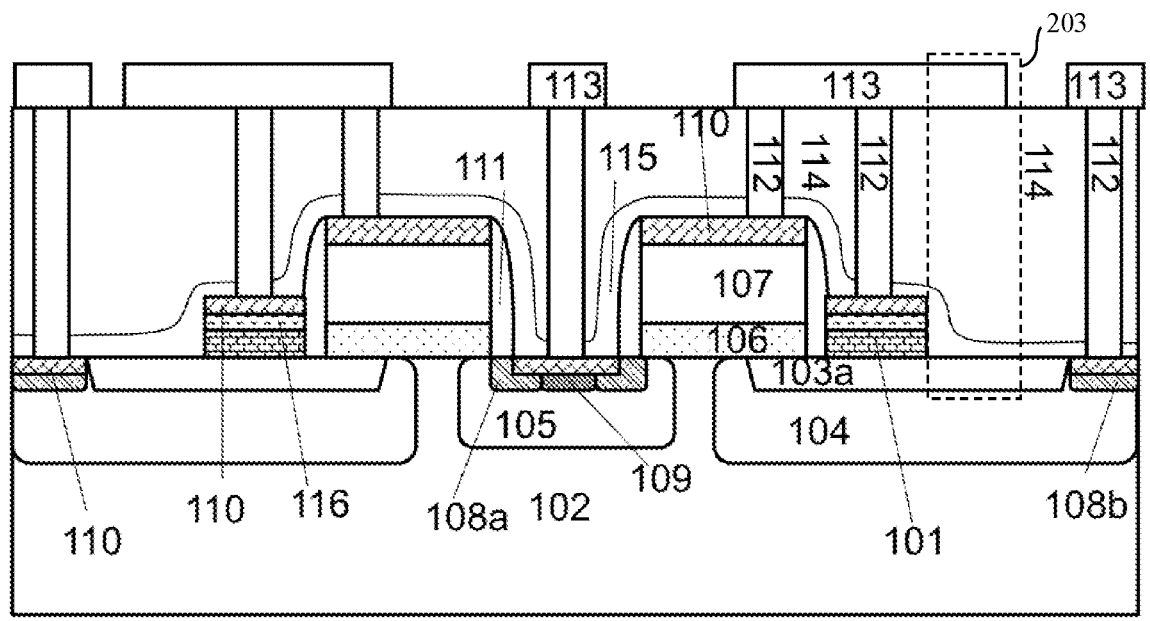
FIG. 6 is a structural schematic view of an LDMOSFET device according to embodiment 5 of the disclosure.

Referring to FIG. 6, it is a structural schematic view of the LDMOSFET device according to embodiment 5 of the disclosure. The difference of the LDMOSFET device according to embodiment 5 of the disclosure from the LDMOSFET device according to embodiment 1 of the disclosure lies in that the LDMOSFET device according to embodiment 5 of the disclosure further includes:

a third field plate dielectric layer and a third field plate formed between the second side of the second field plate dielectric layer and the second side of the drift region field oxide 103*a*. The third field plate dielectric layer includes a superposition structure of the drift region field oxide 103*a* and the first interlayer dielectric film 114. The third field plate is formed by the first metal layer 113 which covers a position above the third field plate dielectric layer and is connected to the first field plate. The first insulating dielectric layer 115 also covers the surface of the drift region field oxide 103*a*. The first interlayer dielectric film 114 is formed on the surface of the first insulating dielectric layer 115. The third field plate dielectric layer is formed by superposing the drift region field oxide 103*a*, the first insulating dielectric layer 115 and the first interlayer dielectric film 114. The forming regions of the third field plate and the third field plate dielectric layer are as illustrated in a dashed line frame 203.

In embodiment 5 of the disclosure, the third field plate dielectric layer includes the superposition structure of the drift region field oxide 103*a* and the first interlayer dielectric film 114. Compared with the second field plate dielectric layer and the first field plate dielectric layer, the thickness of the third field plate dielectric layer is greater, so the relationship between the breakdown voltage and the specific on-resistance of the device can be further optimized.

Embodiment 6 of the disclosure provides an LDMOSFET device.

The difference of the LDMOSFET device according to embodiment 6 of the disclosure from the LDMOSFET device according to embodiment 5 of the disclosure lies in the following:

In the LDMOSFET device according to embodiment 6 of the disclosure, the first polysilicon layer 116 corresponding to the metal silicide 110 of the second field plate is completely converted into the metal silicide 110.

Embodiment 7 of the disclosure provides an LDMOSFET device.

Figure 7:
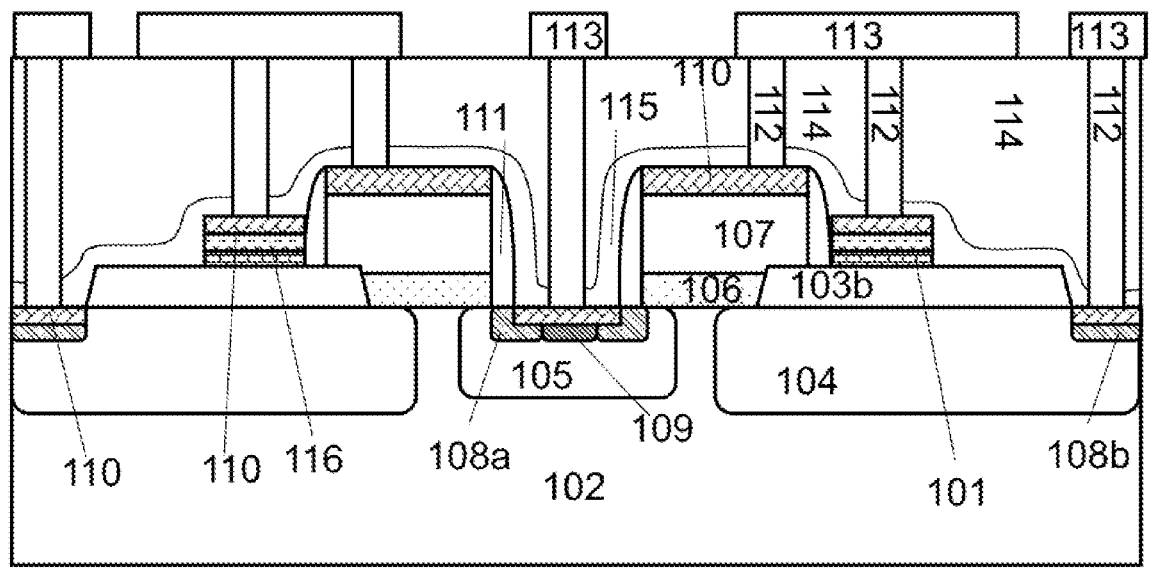
FIG. 7 is a structural schematic view of an LDMOSFET device according to embodiment 7 of the disclosure.

Referring to FIG. 7, it is a structural schematic view of the LDMOSFET device according to embodiment 7 of the disclosure. The difference of the LDMOSFET device according to embodiment 7 of the disclosure from the LDMOSFET device according to embodiment 5 of the disclosure lies in the following:

In the LDMOSFET device according to embodiment 7 of the disclosure, the drift region field oxide 103*b* is formed by an oxide layer which is formed by selectively etching an oxide layer deposited on the surface of the semiconductor substrate 102. Therefore, the drift region field oxide 103*b* in the device according to embodiment 7 of the disclosure is located on the surface of the semiconductor substrate 102.

Embodiment 8 of the disclosure provides an LDMOSFET device.

The difference of the LDMOSFET device according to embodiment 8 of the disclosure from the LDMOSFET device according to embodiment 7 of the disclosure lies in the following:

In the LDMOSFET device according to embodiment 8 of the disclosure, the first polysilicon layer 116 corresponding to the metal silicide 110 of the second field plate is completely converted into the metal silicide 110.

A method for making the LDMOSFET device according to embodiment 1 of the disclosure is provided.

Figure 8A:
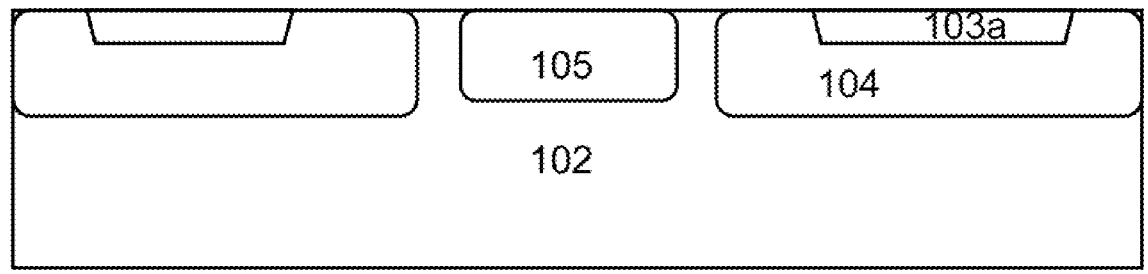
FIG. 8A to FIG. 8C are structural schematic views of the device in each step of a method for making the LDMOSFET device according to embodiment 1 of the disclosure.
Figure 8B:
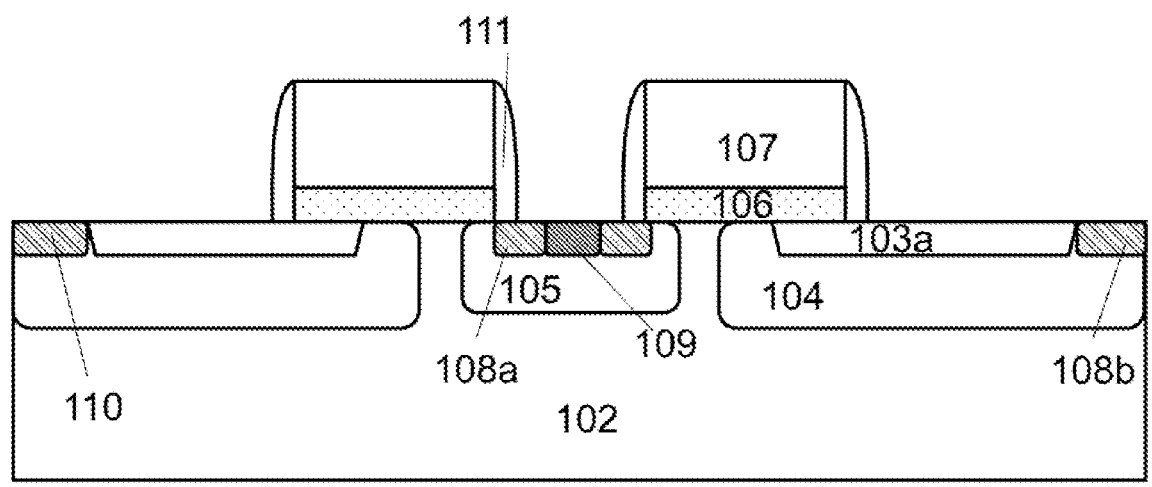
Figure 8C:
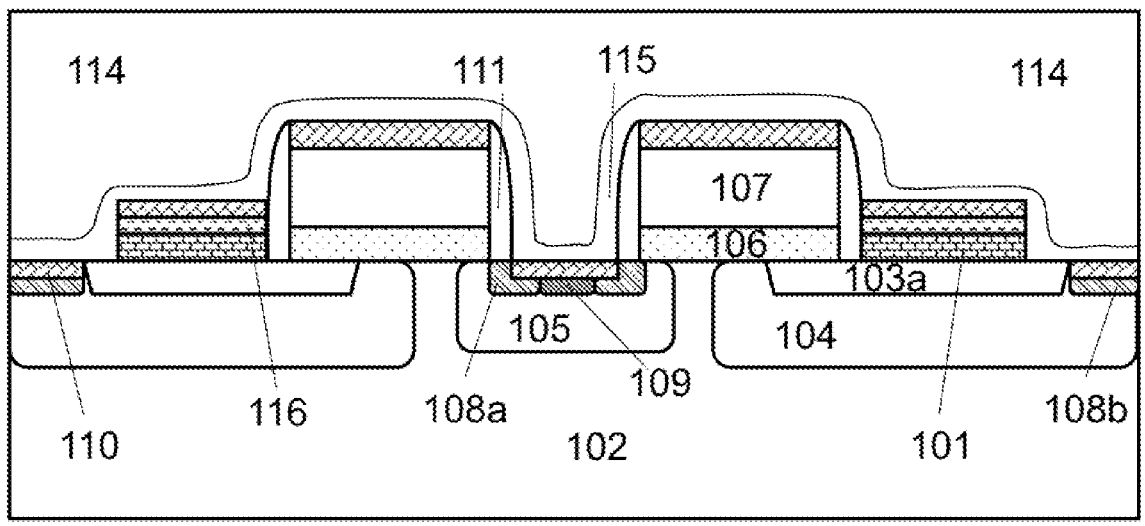

Referring to FIG. 8A to FIG. 8C, they are structural schematic views of the device in each step of the method for making the LDMOSFET device according to embodiment 1 of the disclosure. The method for making the LDMOSFET device according to embodiment 1 of the disclosure includes the following steps:

In step 1, referring to FIG. 8A, a semiconductor substrate 102 is provided, and a drift region field oxide 103*a* is formed in a selected region of the semiconductor substrate 102.

Generally, the semiconductor substrate 102 is a silicon substrate, and a silicon epitaxial layer is formed on the surface of the semiconductor substrate 102. The drift region field oxide 103*a* is formed in the silicon epitaxial layer, and the subsequent drift region 104 and body region 105 are formed in the silicon epitaxial layer.

In the method according to embodiment 1 of the disclosure, the drift region field oxide 103*a* is formed by a shallow trench isolation oxide layer formed by adopting a shallow trench isolation process. The method according to embodiment 1 of the disclosure is described by taking the formation of the LDMOSFET device according to embodiment 1 of the disclosure illustrated in FIG. 3 as an example. The drift region field oxide 103*a* in the devices according to embodiment 2, embodiment 5 and embodiment 6 of the disclosure is formed also by adopting the shallow trench isolation process.

When the LDMOSFET device according to embodiment 3 of the disclosure illustrated in FIG. 5 and the devices according to embodiment 4, embodiment 7 and embodiment 8 of the disclosure are formed, the forming process of the drift region field oxide 103*b* is changed to include: firstly depositing an oxide layer on the surface of the semiconductor substrate 102, and then selectively etching the deposited oxide layer to form the drift region field oxide 103b.

In step 2, referring to FIG. 8A, a drift region 104 is formed in the selected region of the semiconductor substrate 102 by adopting a first-conductive-type ion implantation process. The drift region field oxide 103a is located in a partial region of the drift region 104.

In step 3, referring to FIG. 8A, a body region 105 is formed in the selected region of the semiconductor substrate 102 by adopting a second-conductive-type ion implantation process. The drift region 104 and the body region 105 are in lateral contact or are spaced apart.

In step 4, referring to FIG. 8B, a gate dielectric layer 106 and a polysilicon gate 107 are sequentially formed, a forming region of a gate structure is defined by adopting a photolithography process, and the polysilicon gate 107 and the gate dielectric layer 106 are etched to form the gate structure formed by superposing the etched gate dielectric layer 106 and the polysilicon gate 107 on the surface of the body region 105. The surface of the body region 105 covered by the polysilicon gate 107 is used for forming a channel.

In the method according to embodiment 1 of the disclosure, the material of the gate dielectric layer 106 is silicon oxide. In methods according to other embodiments, the material of the gate dielectric layer 106 may be silicon oxynitride or a high-dielectric-constant material.

The second side of the polysilicon gate 107 is extended to the surface of the drift region field oxide 103a. The polysilicon gate 107 extended to the drift region field oxide 103a forms a field plate. The drift region field oxide 103a at the bottom of the field plate forms a field plate dielectric layer.

After the gate structure is formed, the method further includes a step of forming sidewalls 111 on the side surfaces of the polysilicon gate 107;

a step of performing first-conductive-type heavily doped source and drain implantation to form a source region 108a and a drain region 108b. The source region 108a is formed on the surface of the body region 105. The second side of the source region 108a self-aligned with the first side of the polysilicon gate 107. The drain region 108b is formed in the drift region 104 outside the second side of the drift region field oxide 103a.

The method further includes a step of performing second-conductive-type heavily doped implantation to form a leading-out region 109 of body region on the surface of the body region 105.

In step 5, referring to FIG. 8C, a SAB dielectric layer 101 and a first polysilicon layer 116 are formed, and the first polysilicon layer 116 and the SAB dielectric layer 101 are patterned by adopting a photolithography process. The patterned SAB dielectric layer 101 and the first polysilicon layer 116 are located between the second side of the polysilicon gate 107 and the second side of the drift region field oxide 103a.

The width of the SAB dielectric layer 101 and the corresponding first polysilicon layer 116 is the same, aligned and defined by adopting the same mask.

In step 6, referring to FIG. 8C, metal silicification is performed to form a metal silicide 110. The metal silicide includes metal silicide 110 formed by performing metal silicification to the first polysilicon layer 116. The second field plate dielectric layer is formed by superposing the drift region field oxide 103a and the SAB dielectric layer 101 formed on the surface of the drift region field oxide 103a. The second field plate is formed by the metal silicide 110 formed on the surface of the SAB dielectric layer 101.

The method according to embodiment 1 of the disclosure is described by taking the formation of the LDMOSFET device according to embodiment 1 of the disclosure illustrated in FIG. 3 as an example. In step 6, after the metal silicification is completed, the first polysilicon layer 116 corresponding to the metal silicide 110 of the second field plate retains a part of thickness. When the devices according to embodiment 3, embodiment 5 and embodiment 7 of the disclosure are formed, as well, in step 6, after the metal silicification is completed, the first polysilicon layer 116 corresponding to the metal silicide 110 of the second field plate retains a part of thickness.

When the devices according to embodiment 2, embodiment 4, embodiment 6 and embodiment 8 of the disclosure are formed, the first polysilicon layer 116 corresponding to the metal silicide 110 of the second field plate is completely converted into the metal silicide 110.

The metal silicide 110 is also formed on the surfaces of the polysilicon gate 107, the source region 108, the body region leading-out region 109 and the drain region 108b.

In step 7, a metal interconnection process is performed. The first field plate and the second field plate are connected together through a metal layer formed in the metal interconnection process and are connected to a gate formed by the metal layer.

The number of the metal layer is more than one, the first field plate and the second field plate are connected to a first metal layer 113 through contact holes 112, the first field plate and the second field plate are connected together through the first metal layer 113, and the contact holes 112 pass through a first interlayer dielectric film 114.

After step 7 is completed, the source region 108a and the body region leading-out region are connected to a source formed by the metal layer; the drain region 108b is connected to a drain formed by the metal layer.

The method in step 7, before the first interlayer dielectric film 114 is formed, further includes a step of forming a first insulating dielectric layer 115. The first insulating dielectric layer 115 is formed on the surface of the semiconductor substrate 102 and covers the metal silicide 110 on the surface of the source region 108a, the sidewalls 111 of the polysilicon gate 107, the metal silicide 110 on the surface of the polysilicon gate 107, the second field plate and the surface of the drift region field oxide 103a outside the second side of the second field plate. The first interlayer dielectric film 114 is formed on the surface of the first insulating dielectric layer 115. Generally, the material of the first interlayer dielectric film 114 is an oxide layer, the material of the first insulating dielectric layer 115 consist of an oxide and a nitride layer, and the nitride layer is used as a contact etch stop layer.

When the devices according to embodiment 3, embodiment 5 and embodiment 7 of the disclosure are formed, a third field plate dielectric layer and a third field plate formed between the second side of the second field plate dielectric layer and the second side of the drift region field oxide 103a. The third field plate dielectric layer includes a superposition structure of the drift region field oxide 103a and the first interlayer dielectric film 114. The third field plate is formed by the first metal layer 113 which covers a position above the third field plate dielectric layer and is connected to the first field plate.

In the method according to embodiment 1 of the disclosure, the LDMOSFET device is an N-type device, the first conductive type is N-type, the second conductive type is P-type, and the semiconductor substrate is P-type doped. In methods according to other embodiments, the LDMOSFET device may be a P-type device, the first conductive type may be P-type, and the second conductive type may be N-type.

The disclosure has been described above in detail in combination with the above embodiments, which, however, shall not constitute any limitation to the disclosure. Without departing from the principle of the disclosure, one skilled in the art may make various variations and improvements, which shall also be regarded as falling into the protection scope of the disclosure.

What is claimed is:

1. An LDMOSFET device comprising:
a semiconductor substrate;
a first-conductive-type drift region and a second-conductive-type body region formed in a selected region of the semiconductor substrate; wherein the drift region and the body region are in lateral contact or are spaced apart;
a drift region field oxide formed in a selected region of the drift region;
a gate structure formed by superposing a gate dielectric layer and a polysilicon gate; a first side of the polysilicon gate formed on a surface of the body region, wherein the surface of the body region covered by the polysilicon gate forms a channel;
wherein a second side of the polysilicon gate is extended to a surface of a first side of the drift region field oxide, the polysilicon gate extended to the drift region field oxide forming a first field plate, and the drift region field oxide at the bottom of the first field plate forming a first field plate dielectric layer; and
a second field plate dielectric layer and a second field plate formed between the second side of the polysilicon gate and a second side of the drift region field oxide, wherein the second field plate dielectric layer is formed by superposing the drift region field oxide and a SAB dielectric layer formed on the surface of the drift region field oxide, the second field plate is formed by a metal silicide formed on the surface of the SAB dielectric layer, and the metal silicide of the second field plate is formed by a first polysilicon layer formed on the surface of the SAB dielectric layer through metal silicification;
wherein the first field plate and the second field plate are connected together through a metal layer and are connected to a gate metal formed by the metal layer.

2. The LDMOSFET device according to claim 1, wherein the metal layer includes a plurality of metal layers, each of the first field plate and the second field plate is connected to a first metal layer through contact holes, the first field plate and the second field plate are connected together through the first metal layer, and the contact holes pass through a first interlayer dielectric film.

3. The LDMOSFET device according to claim 2, wherein a third field plate dielectric layer and a third field plate are formed between the second side of the second field plate dielectric layer and the second side of the drift region field oxide, the third field plate dielectric layer comprises a superposition structure of the drift region field oxide and the first interlayer dielectric film, and the third field plate is formed by the first metal layer which covers a position above the third field plate dielectric layer and is connected to the first field plate.

4. The LDMOSFET device according to claim 1, wherein the drift region field oxide is formed by an oxide layer which is formed by selectively etching an oxide layer deposited on the surface of the semiconductor substrate.

5. The LDMOSFET device according to claim 1, wherein the first polysilicon layer corresponding to the metal silicide of the second field plate is completely converted into the metal silicide;
the width of the first polysilicon layer corresponding to the metal silicide of the second field plate dielectric layer and the second field plate is the same, aligned and defined by adopting the same mask.

6. The LDMOSFET device according to claim 2, further comprising:
sidewalls formed respectfully on the first and second side surfaces of the polysilicon gate;
a source region formed by a first-conductive-type heavily doped region and formed on the surface of the body region, a side of the source region is self-aligned with the first side of the polysilicon gate, and the source region connected to a source formed by the metal layer; and
a drain region formed by a first-conductive-type heavily doped region and formed in the drift region outside the second side of the drift region field oxide, and the drain region connected to a drain formed by the metal layer;
wherein the metal silicide is also formed on the surfaces of the polysilicon gate, the source region and the drain region.

7. The LDMOSFET device according to claim 6, wherein a first insulating dielectric layer is formed on the surface of the semiconductor substrate and covers the metal silicide on the surface of the source region, the sidewalls of the polysilicon gate, the metal silicide on the surface of the polysilicon gate, the second field plate and the surface of the drift region field oxide outside the second side of the second field plate; and
wherein the first interlayer dielectric film is formed on the surface of the first insulating dielectric layer.

8. The LDMOSFET device according to claim 3, wherein the first insulating dielectric layer further covers the surface of the drift region field oxide, the first interlayer dielectric film is formed on the surface of the first insulating dielectric layer, and the third field plate dielectric layer is formed by superposing the drift region field oxide, the first insulating dielectric layer and the first interlayer dielectric film.

9. The LDMOSFET device according to claim 1, wherein the drift region field oxide is formed by a shallow trench isolation oxide layer.

10. The LDMOSFET device according to claim 1, wherein the first polysilicon layer corresponding to the metal silicide of the second field plate retains a part of thickness; and
the width of the first polysilicon layer corresponding to the metal silicide of the second field plate dielectric layer and the second field plate is the same, aligned and defined by adopting a same mask.

* * * * *